United States Patent
Bäuml et al.

(10) Patent No.: US 9,210,827 B2
(45) Date of Patent: Dec. 8, 2015

(54) AUTOMATION DEVICE HAVING A HEATSINK

(71) Applicants: Mathias Bäuml, Schwandorf (DE); Julia Michl, Schwandorf (DE); Jürgen Schmelz, Winkelhaid (DE)

(72) Inventors: Mathias Bäuml, Schwandorf (DE); Julia Michl, Schwandorf (DE); Jürgen Schmelz, Winkelhaid (DE)

(73) Assignee: Siemens Aktiengesellschaft, Munich (DE)

(*) Notice: Subject to any disclaimer, the term of this patent is extended or adjusted under 35 U.S.C. 154(b) by 197 days.

(21) Appl. No.: 14/090,892

(22) Filed: Nov. 26, 2013

(65) Prior Publication Data

US 2014/0146478 A1 May 29, 2014

(30) Foreign Application Priority Data

Nov. 27, 2012 (EP) .................................... 12194362

(51) Int. Cl.
*H05K 7/20* (2006.01)
*G06F 1/20* (2006.01)
*H05K 5/00* (2006.01)
*H05K 7/14* (2006.01)
*H05K 5/02* (2006.01)

(52) U.S. Cl.
CPC .............. *H05K 7/1464* (2013.01); *G06F 1/20* (2013.01); *H05K 5/00* (2013.01); *H05K 5/02* (2013.01); *H05K 7/2039* (2013.01); *H05K 7/20127* (2013.01)

(58) Field of Classification Search
CPC ......... H05K 7/20; H05K 7/14; H05K 7/1464; H05K 7/20127; H05K 7/2039; H05K 5/00; H05K 5/02; H01L 23/467; G06F 1/20

USPC ............... 361/679.46, 679.47, 688, 689, 704, 361/705, 709, 710, 714, 719, 721, 722; 165/80.2, 80.3, 104.33, 185, 121; 312/223.2; 174/50, 50.02, 520
See application file for complete search history.

(56) References Cited

U.S. PATENT DOCUMENTS

| | | | |
|---|---|---|---|
| 5,552,965 A | 9/1996 | Habegger | |
| 6,324,057 B1 | 11/2001 | Baran et al. | |
| 7,916,490 B2 * | 3/2011 | Yeh et al. | ........................ 361/752 |
| 2001/0011597 A1 | 8/2001 | Imoto | |
| 2007/0119049 A1 | 5/2007 | Teranaka | |

FOREIGN PATENT DOCUMENTS

| | | |
|---|---|---|
| DE | 103 16 967 | 10/2004 |
| EP | 0 618 758 | 10/1994 |
| EP | 0 845 930 | 6/1998 |
| EP | 1 793 289 | 6/2007 |
| EP | 2 073 616 | 6/2009 |

* cited by examiner

*Primary Examiner* — Michail V Datskovskiy
(74) *Attorney, Agent, or Firm* — Cozen O'Connor

(57) ABSTRACT

An automation device configured for an automation environment and for automating an industrial process includes a basic housing, a front hood, a primary heatsink for dissipating heat from a microprocessor, wherein the front hood is slottable onto the basic housing and assembles to form a closed housing which encloses the primary heatsink, the primary heatsink is rigidly connected to the basic housing on a bottom side of the basic housing via a locating bearing, the front hood includes a projecting retaining element on an inner side, a recess is arranged on a top side of the primary heatsink and into which the retaining element engages when the housing is closed, an elastic shaped element is arranged between the projecting retaining element and the recess, and the elastic shaped element absorbs oscillating forces of the primary heatsink in three spatial axes (x,y,z).

6 Claims, 7 Drawing Sheets

AUTOMATION DEVICE HAVING A HEATSINK

BACKGROUND OF THE INVENTION

1. Field of the Invention

The invention relates to an automation device configured for an automation environment and for automating an industrial process, where the device comprises a basic housing, a front hood and a primary heatsink for dissipating heat from a microprocessor, where the front hood is slottable onto the basic housing and is assembled to form a closed housing that encloses the primary heatsink, the primary heatsink is rigidly connected to the basic housing on a bottom side of the basic housing via a locating bearing, the front hood has a projecting retaining element on an inner side, arranged on a top side of the primary heatsink is a recess into which the retaining element engages when the housing is closed, an elastic shaped element is arranged between the projecting retaining element and the recess, and where the elastic shaped element absorbs oscillating forces of the primary heatsink in three spatial axes.

2. Description of the Related Art

The miniaturization of electronics components has resulted in the increasing realization of higher packing densities/functional densities of electronic components on a flat wiring module, such as a populated printed circuit board. This leads to an increase in the power dissipation loss, in particular in the case of microprocessors, because the performance of microprocessors is steadily increasing and consequently so also are the thermal losses. For example, the installation of state-of-the-art microprocessors, as used for the personal computer sector, in an automation device leads to an enormous increase in the power dissipation loss in the automation device.

In the case of an automation device, there is not necessarily a desire to employ active cooling components, such as a radial fan, in order to dissipate the heat due to the power dissipation loss, because such components are subject to maintenance and susceptible to faults. However, in order nonetheless to be able to dissipate the thermal losses effectively, passive heat dissipation elements, specifically heatsinks, are used for heat dispersal. Compared to the heatsinks employed in personal computer technology, these elements have substantially larger dimensions and a substantially greater mass. In the case of the automation devices, a heatsink can accordingly reach a mass of approximately 1 kg.

SUMMARY OF THE INVENTION

In view of the foregoing, it is an object of the invention to integrate an heatsink of such a size into an automation device such that the automation device withstands the exposure to vibration and shock stresses that are well-known in industrial automation technology.

This and other objects and advantages are achieved in accordance with the invention by an automation device having a primary heatsink which is securable on one side, in this case on the bottom side of the basic housing, sufficiently solidly via one or more locating bearings. In contrast, however, on the opposite side of the primary heatsink, in this case the side directed toward the front hood, a solid, rigid attachment is not possible or, as the case may be, technically not advisable, because this would lead to twisting effects in the entire housing. Two oppositely disposed locating bearings would lead to an overdetermined system and would constitute an impediment to a geometric embodiment or, as the case may be, an embodiment suitable for production.

If a primary heatsink were to be mounted solely via the locating bearing on the bottom side of the basic housing, then stresses due to vibration and shock would result in a significant, unacceptable exaggeration of an amplitude of the directions of movement of the primary heatsink. This could lead to failure of the device due to, e.g., housing fracture or damage to the electronic components or a detachment of a cooling surface from the microprocessor.

Through the embodiment of projecting retaining elements in the front hood, where the retaining elements additionally support an elastic shaped element and the retaining element is inserted together with the shaped element in the recesses of the primary heatsink, the oscillating forces of the primary heatsink are absorbed in three spatial axes.

In this arrangement, the elastic shaped element is implemented such that the tolerances are compensated for and consequently the oscillating forces are optimally absorbed in all three spatial axes. Toward that end, it is advantageous if the basic housing is configured on its external bottom side such that it can be mounted on a profile rail and the front hood, together with its retaining element, is in turn configured such that the oscillating forces of the primary heatsink are transmitted onto the front hood and the front hood transmits the oscillating forces of the primary heatsink onto the basic housing, and the basic housing transmits the oscillating forces of the primary heatsink onto the profile rail.

The retaining element preferably comprises a securing dome with a circumferential groove and the elastic shaped element comprises an O-ring that lies in the circumferential groove. For example, a stable plastic dome could be formed in the front hood, on which dome a groove for an O-ring is impressed. This O-ring ensures support is provided in all three spatial axes. Once the front hood has been mounted onto the basic housing, the dome together with the O-ring is once again seated in a cone-shaped recess in the primary heatsink, where contact of the O-ring against the primary heatsink is ensured at all times in all three spatial axes.

Toward that end, the recesses in the primary heatsink are advantageously cone-shaped.

In a further optimized embodiment of the automation device, a first printed circuit board, a second printed circuit board and a secondary heatsink are provided, where the first printed circuit board is arranged between the bottom side of the primary heatsink and the bottom side of the basic housing, where the first printed circuit board includes an aperture for the locating bearing for connecting the basic housing to the primary heatsink, the second printed circuit board is therein arranged vertically on the first printed circuit board and carries the microprocessor on one side of the second printed circuit board and the secondary heatsink on the other side of the second printed circuit board, with a lateral surface of the primary heatsink bearing against the microprocessor such that the secondary heatsink and the primary heatsink form a cooling pack enclosing the microprocessor.

To ensure a bearing surface for the microprocessor on the primary heatsink fits in the best possible manner against the microprocessor, the recesses in the primary heatsink are arranged in the region of the edge of the primary heatsink that is directed toward the secondary heatsink.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing illustrates an exemplary embodiment, in which.

DETAILED DESCRIPTION OF THE PREFERRED EMBODIMENTS

Figure 1:
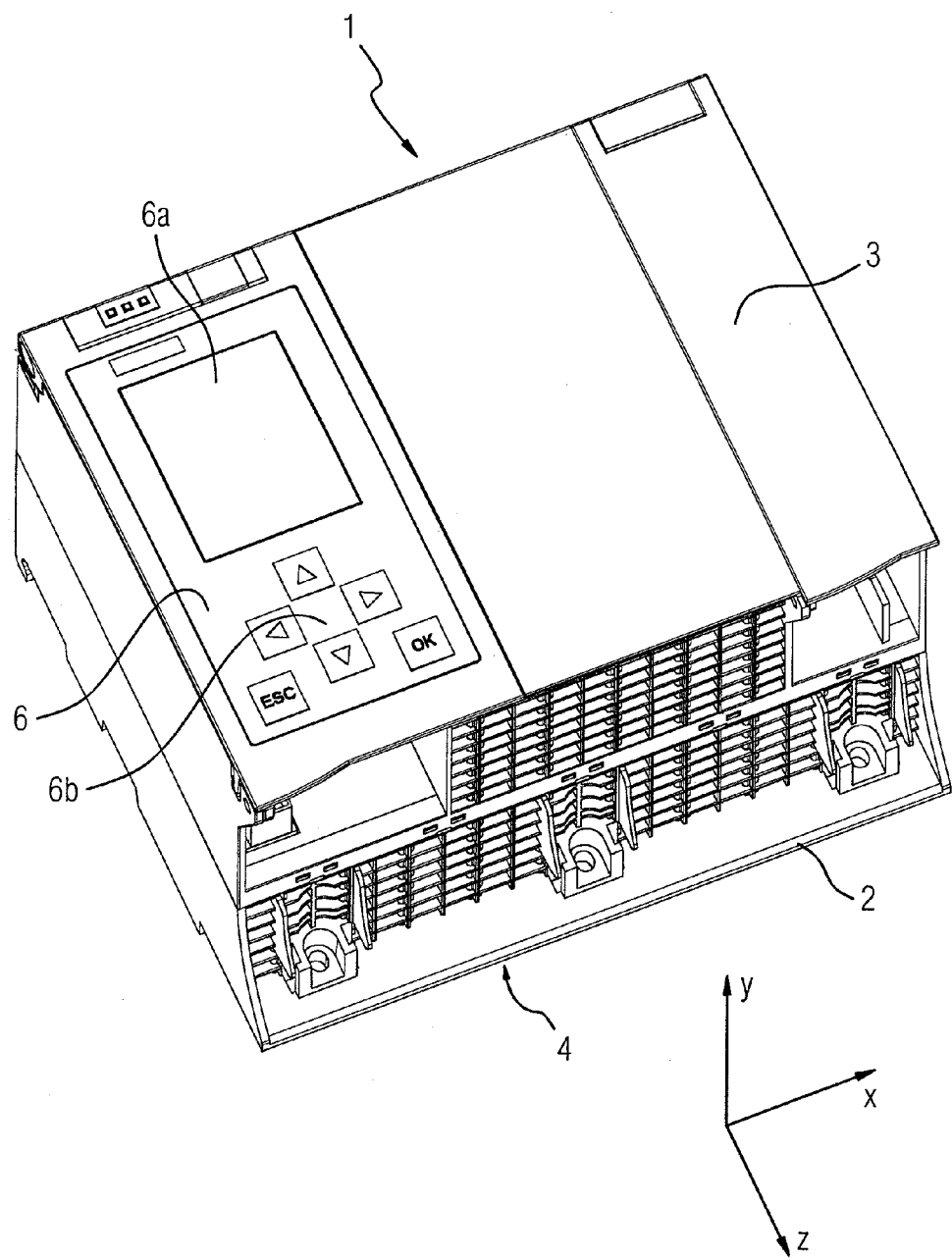
FIG. 1 shows an automation device in a three-dimensional view in accordance with the invention.

FIG. 1 shows an automation device 1 configured for an automation environment for automating an industrial process. Because automation devices are subject to harsh environmental conditions, such as humidity, temperature differences, and/or vibration and shock loads, they must be implemented in a particularly robust design. The automation device 1 shown has a basic housing 2 and a front hood 3, with a front flap 6 having an integral display 6a and an integral control panel 6b additionally being depicted.

Shown to the right of the automation device 1 are three spatial axes x,y,z. When subject to stress in the form of a shock, jolt or vibration, the automation device 1 and in particular the inner workings of the automation device 1 can move in the direction of the three spatial axes x,y,z.

Figure 2:
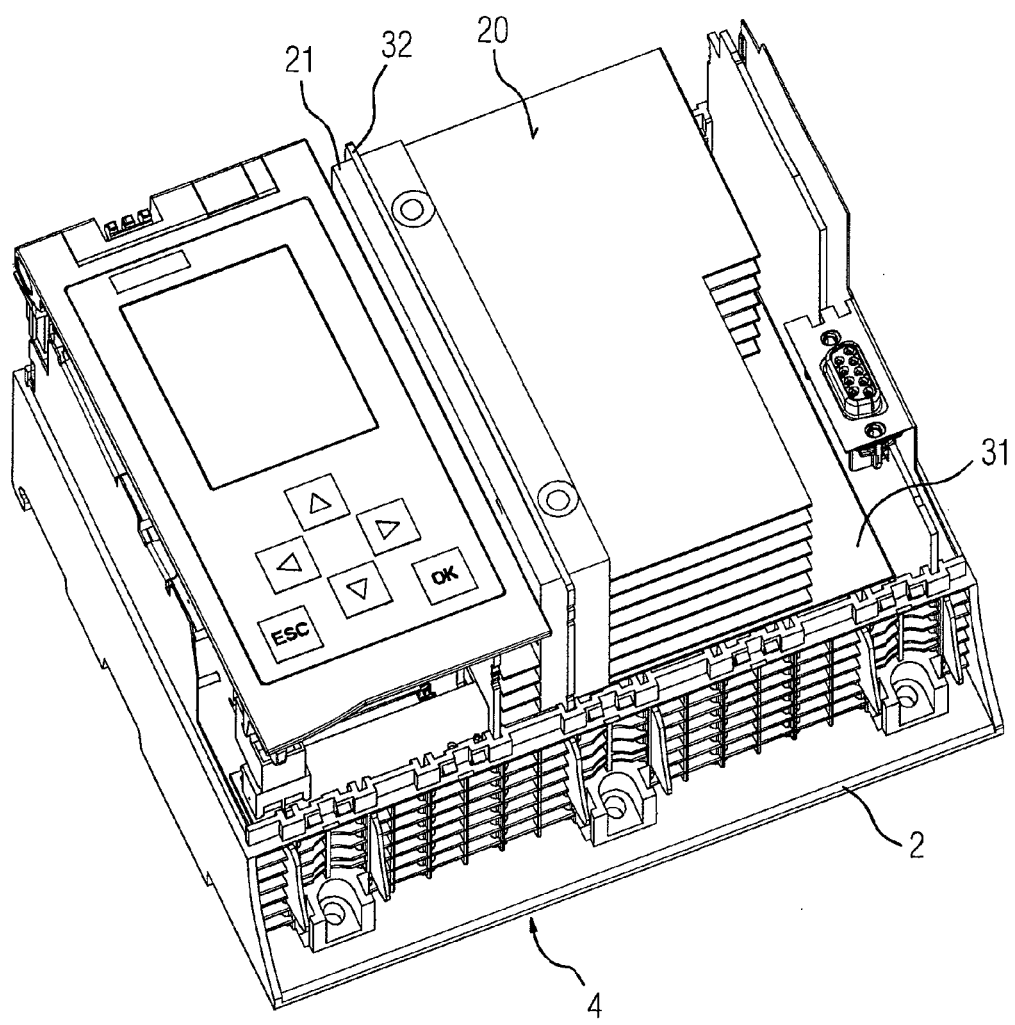
FIG. 2 shows the open automation device of FIG. 1 in a three-dimensional view.

FIG. 2 shows the automation device 1 of FIG. 1 in an open state with the front hood 3 removed. The primary heatsink 20, which is arranged on a first printed circuit board 31, is now clearly to be seen. The first printed circuit board 31, in turn, is seated on a bottom side 4 of the basic housing 2. A second printed circuit board 32 stands vertically on the first printed circuit board 31 and is arranged between the primary heatsink 20 and a secondary heatsink 21. The primary heatsink 20 and the secondary heatsink 21 form a heatsink pack. In this view shown in FIG. 2, the size of a normal heatsink (secondary heatsink) compared to a particularly large heatsink (primary heatsink) is especially apparent. Because today's state-of-the-art microprocessors increasingly generate more thermal losses, a primary heatsink having a larger structural arrangement is necessary, whereby its mass can potentially already lie in the range of several kilograms.

Figure 3:
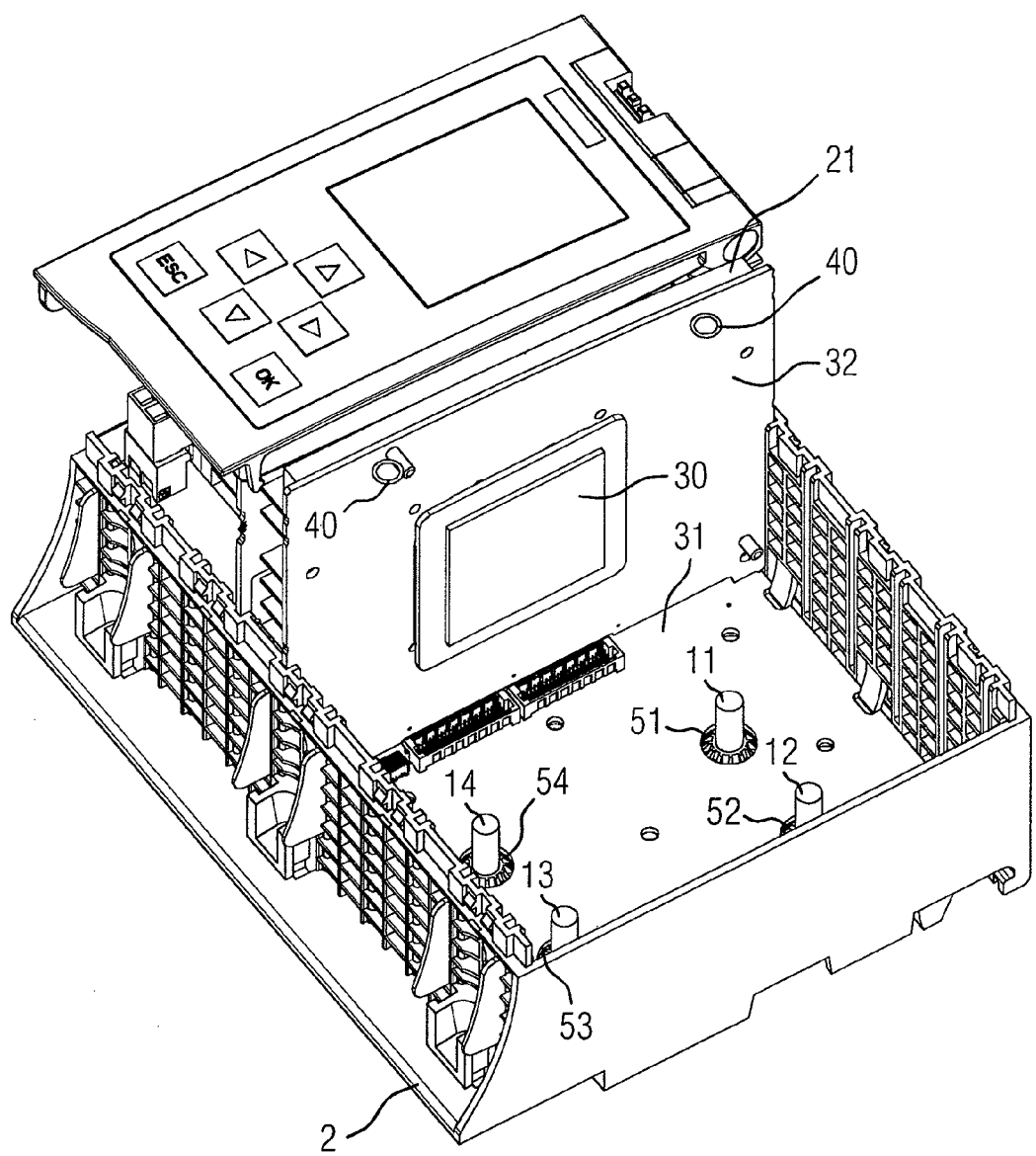
FIG. 3 shows the automation device of FIG. 1 without the primary heatsink in a three-dimensional view.

FIG. 3 shows the automation device 1 with the primary heatsink 20 removed. In this case, the second printed circuit board 32 shows that it is carrying the microprocessor 30. The first printed circuit board 31 has a first aperture 51, a second aperture 52, a third aperture 53 and a fourth aperture 54, through each of which a stud bolt projects, and the screwed connections of the primary heatsink to the stud bolts accordingly form a first locating bearing 11, a second locating bearing 12, a third locating bearing 13 and a fourth locating bearing 14.

Figure 4:
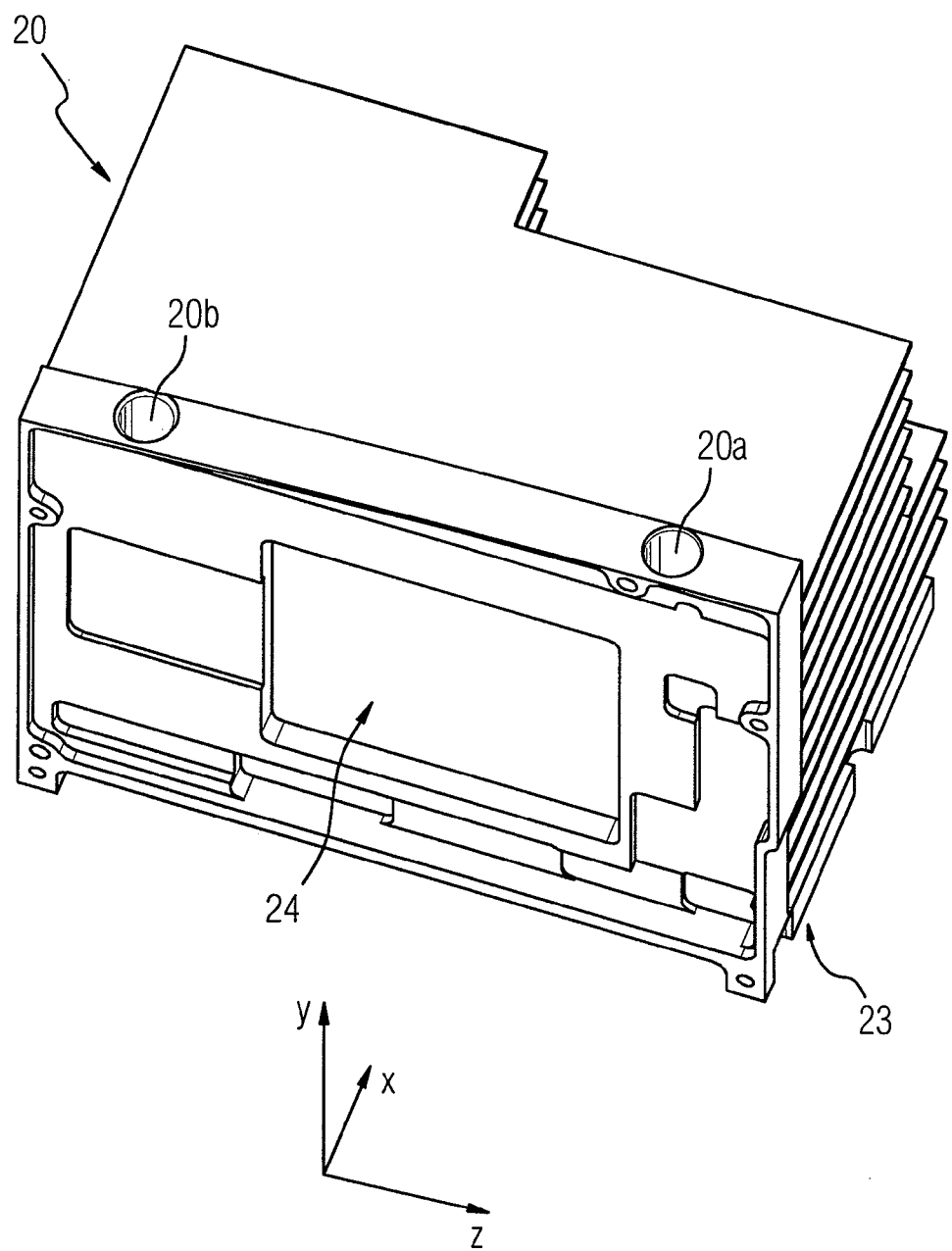
FIG. 4 shows the primary heatsink in a three-dimensional view in accordance with the invention.

According to FIG. 4, the primary heatsink 20 is depicted in an individual view. In the region of the edge directed toward the secondary heatsink 21 (see FIG. 2), the primary heatsink 20 has a first recess 20a and a second recess 20b. The primary heatsink stands with a bottom side 23 on the first printed circuit board 31.

Figure 5:
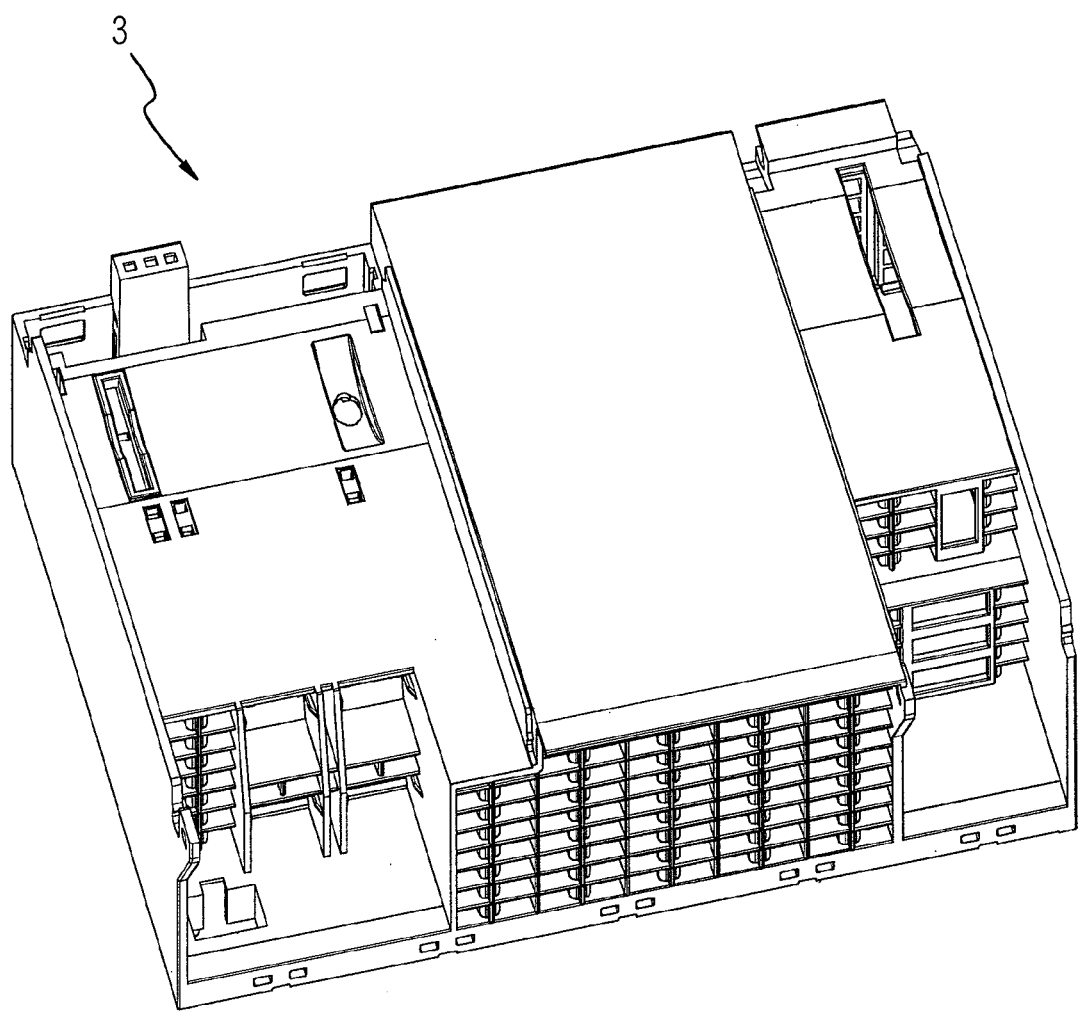
FIG. 5 shows the front hood of FIG. 1.
Figure 6:
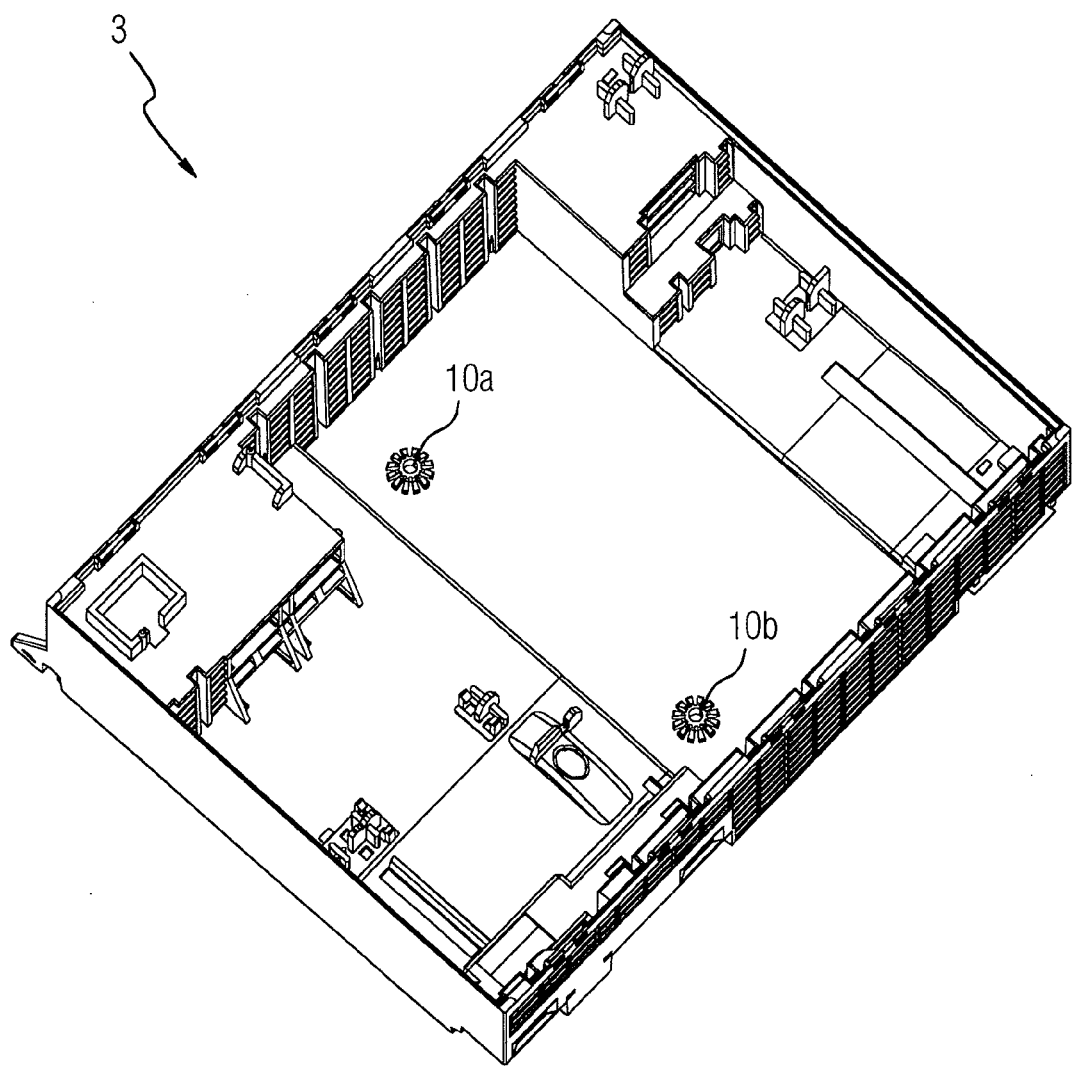
FIG. 6 shows the front hood of FIG. 1 looking toward the inside.

FIGS. 5 and 6 depict the front hood 3, FIG. 5 showing the front hood 3 in a plan view onto the outside and FIG. 6 showing the front hood 3 in a plan view onto the inside. The first retaining element 10a and the second retaining element 10b are shown in particular in FIG. 6. When the front hood 3 is placed onto the basic housing 2, the first retaining element 10a engages in the first recess 20a of the primary heatsink 20 and the second retaining element 10b engages in the second recess 20b of the primary heatsink 20. Accordingly, a first stable plastic dome and a second stable plastic dome are formed in each case in the front hood 3, on which domes a groove 41 for an O-ring is additionally incorporated.

Figure 7:
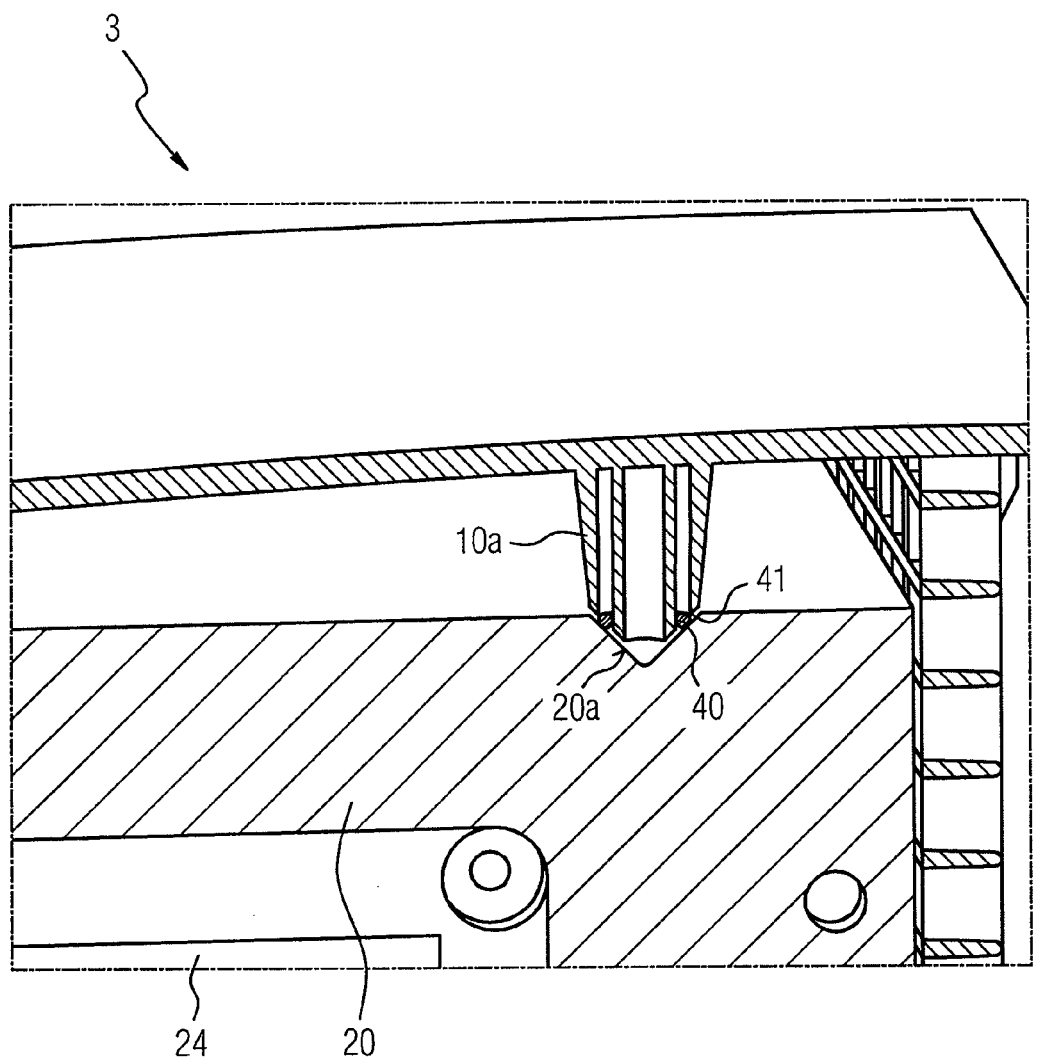
FIG. 7 shows a section through the front hood, the retaining element and the primary heatsink at the position of the recess.

The arrangement of the O-ring is illustrated in FIG. 7, which shows a sectional view. In FIG. 7, the plastic dome is represented as the first retaining element 10a. The plastic dome has a circumferential groove 41 in which an elastic shaped element 40, specifically the O-ring, is inserted. The bearing surface 24 for the microprocessor 30 can be seen in outline on the primary heatsink 20.

After the front hood 3 has been mounted onto the basic housing 2, the plastic dome with the O-ring is once again located in the cone-shaped recess in the primary heatsink 20, a contact of the O-ring against the primary heatsink 20 being ensured at all times in all three spatial axes x,y,z. In this way, it is ensured without great additional expenditure on a fastener that the generation of great forces is avoided in all directions, specifically along the three spatial axes x,y,z, and consequently the automation device 1 is relieved of mechanical load, thus being rendered very robust. Advantages to be cited are: effective damping of oscillating forces in all three spatial directions; use of a simple, low-cost standard part, namely the O-ring; higher potential vibration loading, making for a device of higher quality; easier installation of an additional fastening means for a primary heatsink. In addition, larger, more powerful heatsinks can be installed for approximately the same cost.

Thus, while there have shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An automation device configured for an automation environment for automating an industrial process, comprising:
   a basic housing;
   a front hood having a projecting retaining element on an inner side;

a primary heatsink for dissipating heat from a microprocessor, the front hood being slottable onto the basic housing and assembled to form a closed housing which encloses the primary heatsink;

a locating bearing rigidly connecting the primary heatsink to the basic housing on a bottom side of the basic housing;

a recess arranged on a top side of the primary heatsink, the retaining element engaging into the recess when the basic housing is closed; and an elastic shaped element arranged between the projecting retaining element and the recess, the elastic shaped element absorbing oscillating forces of the primary heatsink in three spatial axes.

2. The automation device as claimed in claim 1, wherein the basic housing is formed on its external bottom side to be fixedly mounted on a profile rail and the front hood with the retaining element is formed such that the oscillating forces of the primary heatsink are transmitted onto the front hood and the front hood transmits the oscillating forces of the primary heatsink onto the basic housing which transmits the oscillating forces of the primary heatsink onto the profile rail.

3. The automation device as claimed in claim 1, wherein the retaining element comprises a fastening dome having a circumferential groove and the elastic shaped element comprises an O-ring which lies in the circumferential groove.

4. The automation device as claimed in claim 1, wherein the recess is cone-shaped.

5. The automation device as claimed in claim 1, further comprising:

a first printed circuit board including an aperture for the locating bearing and for connecting the basic housing to the primary heatsink, the first printed circuit board is arranged between a bottom side of the primary heatsink and the bottom side of the basic housing;

a second printed circuit board arranged vertically on the first printed circuit board and carries the microprocessor on one side of the second printed circuit board and the secondary heatsink on another side of the second printed circuit board; and a secondary heatsink;

wherein a lateral surface of the primary heatsink bears against the microprocessor such that the secondary heatsink and the primary heatsink form a cooling pack enclosing the microprocessor.

6. The automation device as claimed in claim 5, wherein recesses arranged on the topside of the primary heatsink are arranged in a region of an edge of the primary heatsink which is directed toward the secondary heatsink.

* * * * *